US011850683B2

(12) United States Patent
Lee

(10) Patent No.: US 11,850,683 B2
(45) Date of Patent: Dec. 26, 2023

(54) FLUX TOOL USING ELASTIC PAD

(71) Applicant: S.S.P. INC., Incheon (KR)

(72) Inventor: Kyouho Lee, Suwon-si (KR)

(73) Assignee: S.S.P. INC., Incheon (KR)

( * ) Notice: Subject to any disclaimer, the term of this patent is extended or adjusted under 35 U.S.C. 154(b) by 0 days.

(21) Appl. No.: 17/908,062

(22) PCT Filed: Feb. 16, 2021

(86) PCT No.: PCT/KR2021/001936
§ 371 (c)(1),
(2) Date: Oct. 4, 2022

(87) PCT Pub. No.: WO2021/194093
PCT Pub. Date: Sep. 30, 2021

(65) Prior Publication Data
US 2023/0087608 A1 Mar. 23, 2023

(30) Foreign Application Priority Data

Mar. 27, 2020 (KR) .......................... 10-2020-0037517
Jan. 7, 2021 (KR) .......................... 10-2021-0001758

(51) Int. Cl.
*B23K 3/00* (2006.01)
*B23K 3/06* (2006.01)
(Continued)

(52) U.S. Cl.
CPC ............ *B23K 3/0623* (2013.01); *B23K 3/082* (2013.01); *H01L 24/11* (2013.01); *H01L 24/75* (2013.01); *H05K 3/34* (2013.01)

(58) Field of Classification Search
CPC ........ B23K 3/0623; B23K 3/082; B23K 3/06; B23K 3/08; B23K 1/203; H01L 24/11; H01L 24/75; H05K 3/34; H05K 3/3489
(Continued)

(56) References Cited

U.S. PATENT DOCUMENTS 5,676,305 A * 10/1997 Potter .................. H05K 3/3489
228/223
5,834,062 A * 11/1998 Johnson .............. B05C 11/1034
427/256

(Continued)

FOREIGN PATENT DOCUMENTS

JP H08-266980 10/1996
JP H08340174 A * 12/1996
(Continued)

*Primary Examiner* — Kiley S Stoner
(74) *Attorney, Agent, or Firm* — Bridgeway IP Law Group, PLLC; Jihun Kim

(57) ABSTRACT

A flux tool allows the elastic pad to pressurize each flux pin individually in a process of dotting flux, so that even though a wafer or die may be deformed, high-quality flux dotting is achieved. Specifically, the flux tool allows the elastic pad pressurizing the flux pins to be made of rubber, especially silicone, so that primarily, the flux pins are entirely pressurized uniformly by means of the elastic force of the elastic pad, and secondarily, each flux pin is individually pressurized against the underside of the elastic pad, thereby adjusting the heights of the flux pins upon flux dotting according to the flatness or bent shape of the wafer or die to minimize the flux dotting defects.

2 Claims, 10 Drawing Sheets

(51) Int. Cl.
*B23K 3/08* (2006.01)
*H01L 23/00* (2006.01)
*H05K 3/34* (2006.01)

(58) Field of Classification Search
USPC .............. 228/33, 36, 41, 207, 214, 223–224
See application file for complete search history.

(56) References Cited

U.S. PATENT DOCUMENTS

| | | | | |
|---|---|---|---|---|
| 5,899,376 | A * | 5/1999 | Tatumi | B23K 1/203 228/36 |
| 6,460,755 | B1 * | 10/2002 | Inoue | B23K 3/0623 228/41 |
| 11,235,404 | B2 * | 2/2022 | Arvin | B23K 3/08 |
| 2010/0209674 | A2 * | 8/2010 | Ng | B23K 1/203 118/200 |
| 2012/0006364 | A1 * | 1/2012 | Kim | H01L 21/67051 134/99.1 |
| 2014/0242753 | A1 * | 8/2014 | Yeo | H01L 24/75 228/33 |
| 2019/0247944 | A1 * | 8/2019 | Hsu | B23K 3/082 |
| 2019/0275600 | A1 * | 9/2019 | Hsu | H01L 24/10 |
| 2019/0295976 | A1 * | 9/2019 | Niwa | H01L 24/05 |
| 2022/0020719 | A1 * | 1/2022 | Li | B23K 1/203 |
| 2023/0007787 | A1 * | 1/2023 | Lee | H05K 3/3489 |

FOREIGN PATENT DOCUMENTS

| | | | | |
|---|---|---|---|---|
| JP | H0982719 | A * | 3/1997 | |
| JP | 2001035873 | A * | 2/2001 | ............ B23K 1/203 |
| JP | 2011-018948 | A | 6/2011 | |
| JP | 2011-108948 | A | 6/2011 | |
| JP | 2011108948 | A * | 6/2011 | ............ H01L 24/11 |
| KR | 10-2005-0107196 | A | 11/2005 | |
| KR | 10-2018-0119269 | A | 11/2018 | |
| KR | 2018119269 | A * | 11/2018 | ........... H01L 24/742 |
| KR | 20180119269 | A * | 11/2018 | |
| KR | 20190055374 | A * | 5/2019 | |
| KR | 10-2019-0074699 | A | 6/2019 | |
| KR | 10-2206228 | B1 | 1/2021 | |
| KR | 2206228 | B1 * | 1/2021 | ........... B23K 3/0623 |
| KR | 102206228 | B1 * | 1/2021 | |

* cited by examiner

FLUX TOOL USING ELASTIC PAD

TECHNICAL FIELD

The present invention relates to a flux tool using an elastic pad, and more specifically, to a flux tool that constitutes flux printing equipment for dotting flux for attaching solder balls to a wafer.

In specific, the present invention relates to a flux tool using an elastic pad that is capable of allowing the elastic pad to pressurize each of flux pins individually in a process of dotting flux, so that even though a wafer or die may be deformed, high-quality flux dotting is achieved.

Further, the present invention relates to a flux tool using an elastic pad that is capable of allowing the elastic pad to have a conductive thin film disposed on the underside thereof to prevent static electricity from being generated and avoid the elastic pad from being damaged or deformed.

BACKGROUND ART

Semiconductor technologies have been developed to improve the miniaturization and integration of devices, and as information technology (IT) devices become smaller, recently, low-power and high-performance chips capable of processing large capacity data have been introduced.

A flip chip as one of semiconductor chip packages made through such development in the semiconductor technologies is produced by directly attaching solder balls as bump balls made of solder to a wafer, not using a metal lead (wire), when a semiconductor unit called a die is mounted on the wafer, and accordingly, the flip chip is called a wireless semiconductor.

Like this, as the wafer becomes thinner and the number of input/output (I/O) terminals becomes increased, electronic devices have high performance and low power and become lighter, thinner, shorter, and smaller, and recently, wafer level chip scale package (WLCSP) technologies in which the solder balls as bump balls are directly attached to the wafer to make semiconductor packages have been developed. Like this, a system for attaching the solder balls to the wafer is called a solder ball placement system.

So as to attach the solder balls directly to the wafer, further, flux (which may refer to solder paste) is first printed on the wafer, and then, the solder balls are attached to the wafer onto which the flux is applied.

One of conventional flux tools for printing flux is disclosed in Korean Patent No. 10-1364043 entitled 'Flux tool and ball tool of solder ball mounting equipment' to obtain easy compensation for position error between a flux tool and a ball tool so that solder balls are attached to accurate positions.

However, the conventional flux tools as well as the above mentioned technology are configured to perform compensation for flux pin position errors on the plane, whereas they fail to achieve compensation for flux pin position errors in height.

As semiconductor products become lighter, thinner, shorter, and smaller, for example, the wafer or die becomes thinner so that it may be bent.

If the wafer or die is bent, flux may not be dotted to a portion where the wafer or die is low in height in a process of dotting the flux by a flux tool.

Of course, the flux tool in the above-mentioned conventional technology is configured to pressurize the flux pins, but the configuration is made to pressurize the flux pins entirely by means of a back plate made of a metal material, so that if the wafer or die is bent, flux dotting defects may occur.

In the case where the flux tool pressurizes the flux pins by means of an elastic pad, further, the elastic pad is made of an elastic material such as rubber, silicone, and the like, and accordingly, static electricity may be generated from the elastic pad, thereby causing limitations in the movements of the flux pins and making the surface of the elastic pad damaged or deformed according to the characteristics of the soft pad.

(Patent Literature 1) Korean Patent No. 10-1364043 entitled 'Flux tool and ball tool of solder ball mounting equipment'

DISCLOSURE

Technical Problem

Accordingly, the present invention has been made in view of the above-mentioned problems occurring in the related art, and it is an object of the present invention to provide a flux tool using an elastic pad that is capable of allowing the elastic pad to pressurize each of flux pins individually in a process of dotting flux, so that even though a wafer or die may be deformed, high-quality flux dotting is achieved.

It is another object of the present invention to provide a flux tool using an elastic pad that is capable of the elastic pad pressurizing flux pins to be made of rubber, especially silicone, so that primarily, the flux pins are entirely pressurized uniformly by means of the elastic force of the elastic pad, and secondarily, each flux pin is individually pressurized against the underside of the elastic pad, thereby minimizing defects in the flux dotting process.

It is yet another object of the present invention to provide a flux tool using an elastic pad that is capable of preventing static electricity from being generated from the elastic pad and avoiding the surface of the elastic pad from being damaged or deformed.

Technical Solution

To accomplish the above-mentioned objects, according to the present invention, there is provided a dual-type solder ball placement system including: a flux tool of flux printing equipment for dotting flux for attaching solder balls to a wafer of a semiconductor chip package, the flux tool including: a pin block having a plurality of pin holes formed thereon in a given pattern and flux pins inserted into the pin holes; and at least one elastic pad disposed on top of the pin block to pressurize the flux pins.

Further, the elastic pad may be adapted to pressurize each flux pin individually by means of the elastic force generated therefrom to allow the flux pins to be uniformly pressurized against the wafer or a die even though the wafer or the die is bent.

In addition, the elastic pad may have a conductive thin film located on the undersides thereof.

Moreover, the conductive thin film may be made of a non-metal conductive material and have a hard film located on the underside thereof, the hard film having relatively higher hardness than the conductive thin film and the elastic pad.

Further, the conductive thin film may be made of a metal material.

Advantageous Effects

According to the present invention, the flux tool is configured to allow the elastic pad to pressurize each of the flux pins individually in the process of dotting the flux, so that even though the wafer or die may be deformed, high-quality flux dotting is achieved.

In specific, the flux tool is configured to allow the elastic pad pressurizing the flux pins to be made of rubber, especially silicone, so that primarily, the flux pins are entirely pressurized uniformly by means of the elastic force of the elastic pad, and secondarily, each flux pin is individually pressurized against the underside of the elastic pad, thereby adjusting the heights of the flux pins upon flux dotting according to the flatness or bent shape of the wafer or die.

Accordingly, the flux tool according to the present invention can minimize defects occurring in the flux dotting process of attaching the solder balls to the wafer.

As a result, the flux tool according to the present invention can greatly improve a quality of flux printing and a yield in the solder ball attaching process as the post-process of the flux printing.

Accordingly, the present invention is applicable to semiconductor fields, semiconductor package manufacturing fields, PCB manufacturing fields, particularly wafer level chip scale package (WLCSP)-based manufacturing fields, solder ball placement system fields, flux tool and flux printing equipment having the flux tool fields, and other fields similar or related thereto, thereby improving reliability and competitiveness of products.

MODE FOR INVENTION

Hereinafter, exemplary embodiments of a flux tool using an elastic pad according to the present invention will be described in detail with reference to the accompanying drawings.

Figure 1:
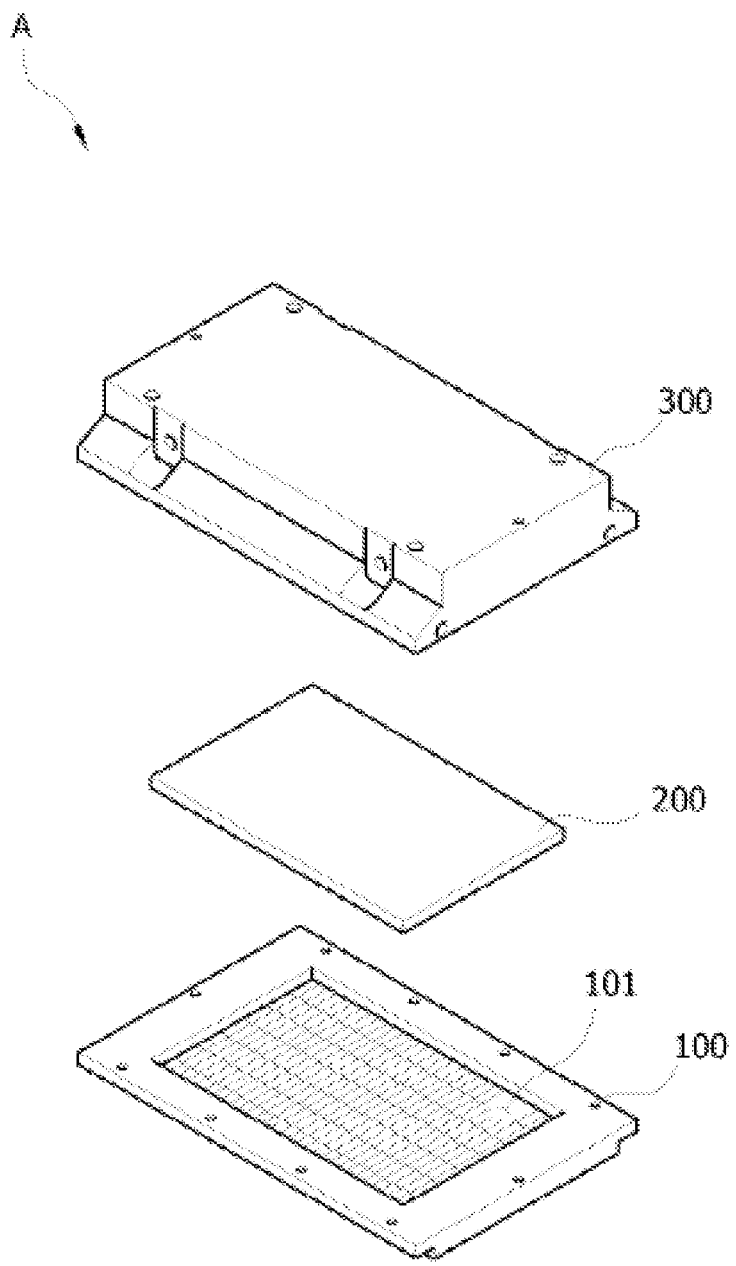
FIG. 1 is an exploded perspective view showing a flux tool using an elastic pad according to an embodiment of the present invention.
Figure 2:
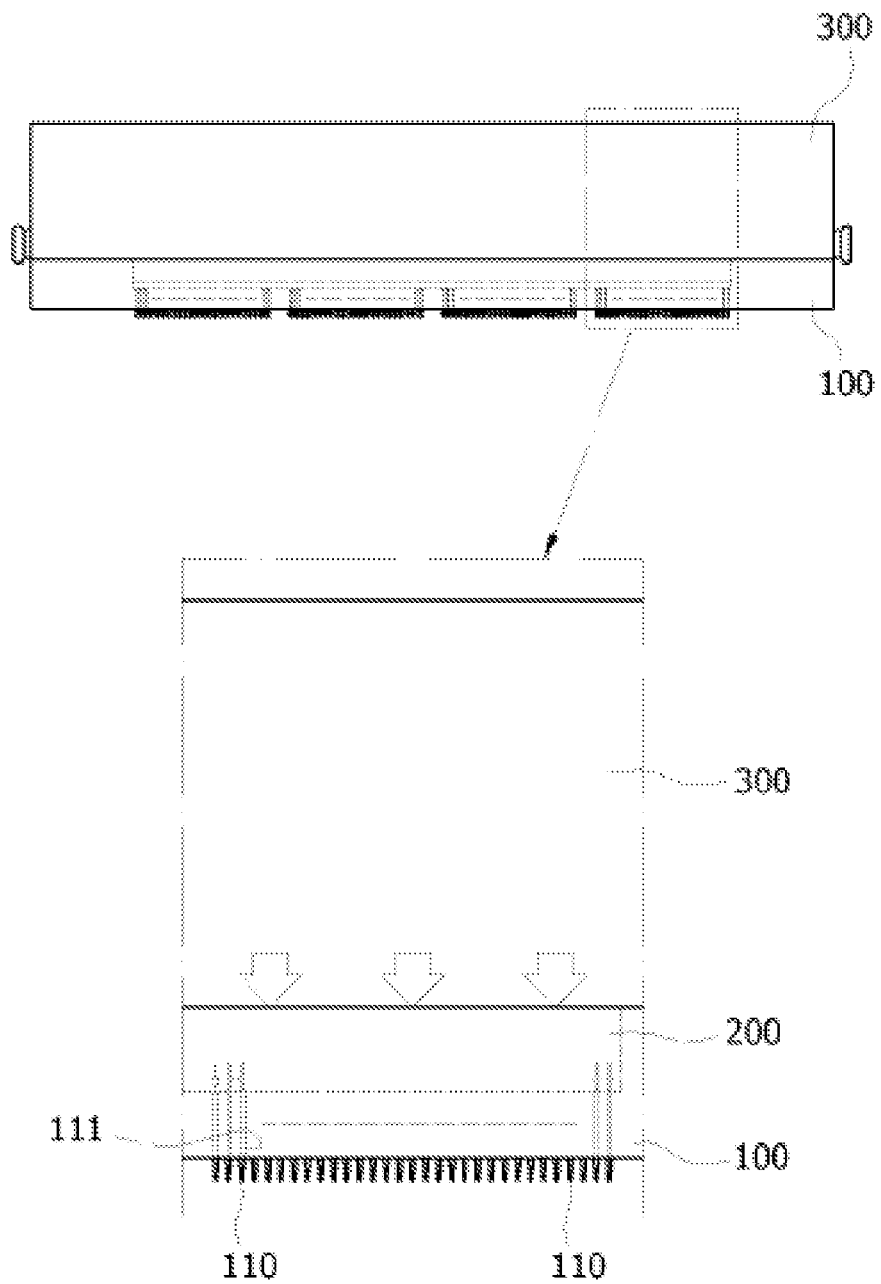
FIG. 2 is a partially enlarged view showing the flux tool of FIG. 1.

FIG. 1 is an exploded perspective view showing a flux tool using an elastic pad according to an embodiment of the present invention, and FIG. 2 is a partially enlarged view showing the flux tool of FIG. 1.

Referring to FIG. 1, a flux tool A according to the present invention includes a pin block 100, an elastic pad 200, and a cover block 300 and constitutes flux printing equipment for dotting flux for attaching solder balls to a wafer.

The pin block 100 has a plurality of pin holes 111 formed on the underside thereof in a given pattern and flux pins 110 inserted into the pin holes 111, and in dipping and dotting processes, the flux pins 110 move upward and downward from the corresponding pin holes 111. In this case, the dipping process is a process wherein flux is applied to the flux pins 110 moving downward, and the dotting process is a process wherein the flux applied to the flux pins 110 is printed.

The elastic pad 200 is located on top of the pin block 100 to pressurize the flux pins 110 by means of the elastic force generated therefrom, and in the dipping and dotting processes, the elastic pad 200 serves to adjust the heights of the lower ends of the flux pins 110 according to the flux-dotted surface (generally top surface) of a wafer or die.

If the flux tool A is used with a given number of times, it is subjected to a cleaning process wherein the flux remaining on the flux pins 110 is removed, and to melt the remaining flux, in this case, heat with a given temperature is applied to the flux pins 110 and even to the elastic pad 200.

Accordingly, the elastic pad 200 is made of an elastic material having high heat resistance capable of resisting the heat, desirably silicone.

Further, the elastic pad 200 serves to allow the flux pins 110 moving to the interiors of the pin holes 111 in the dipping and dotting processes to return to their original position.

As shown in FIG. 2, the entire top of the elastic pad 200 is pressurized by the cover block 300, and the underside thereof pressurizes each flux pin 110 individually.

As a result, the flux tool A according to the present invention is configured to pressurize the flux pins 110 disposed on the pin block 100 with the uniform pressure, while pressurizing each flux pin 110 individually by means of the elastic force of the elastic pad 200, so that even though the wafer or die may be deformed, the flux is dotted on the flux-dotted surface (top surface) of the wafer or die, thereby ensuring high-quality dotting for the product.

Further, a plurality of elastic pads 200 may be provided correspondingly to the structure of the pin block 100.

Figure 3:
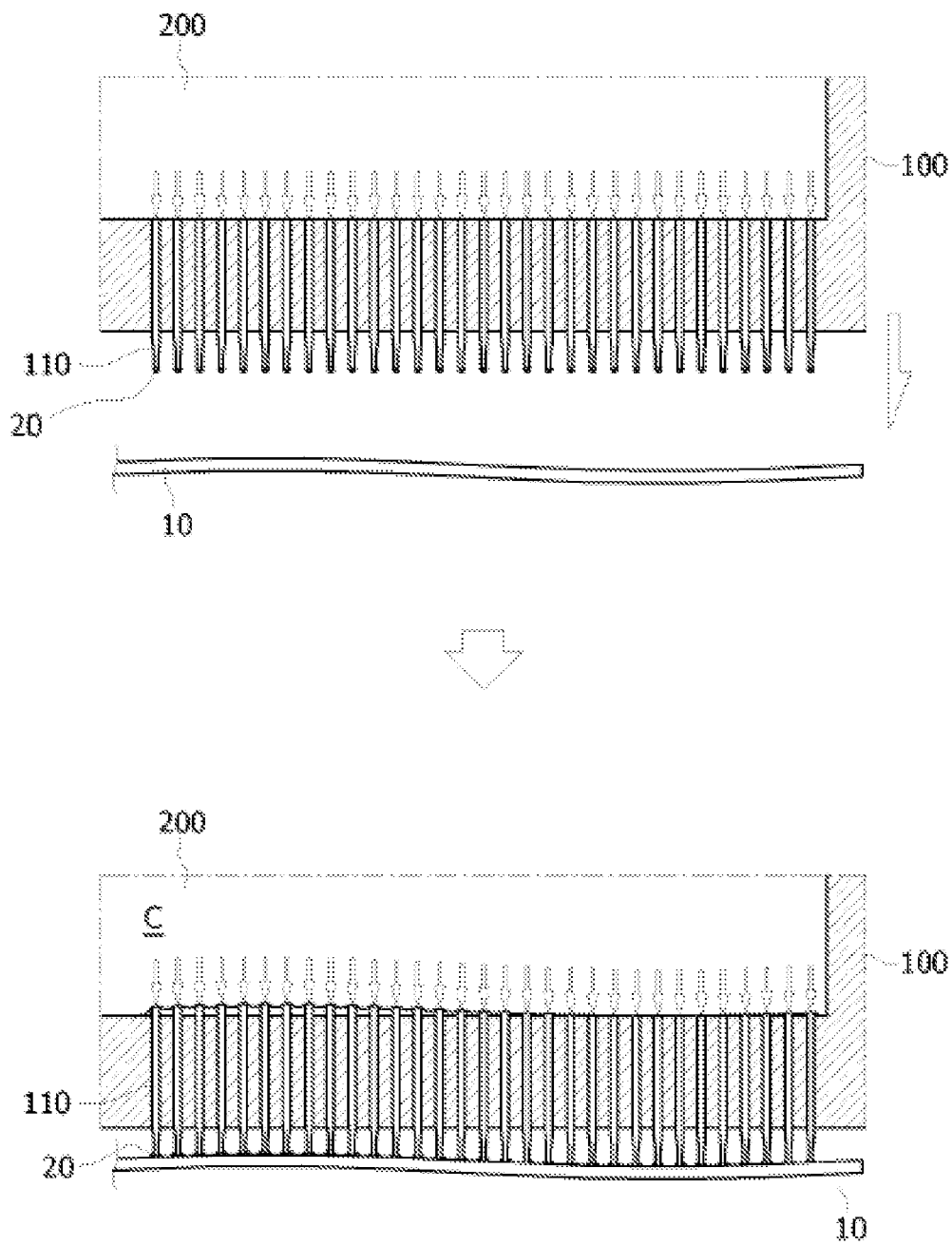
FIG. 3 is a sectional view showing the functions of the flux tool of FIG. 2.

FIG. 3 is a sectional view showing the functions of the flux tool of FIG. 2.

If a wafer 10 on which flux 20 is dotted is bent, as shown at the upper side in FIG. 3, the flux pins 110 of the pin block 100 move independently of each other, as shown at the lower side in FIG. 3.

In specific, the tips (lower ends) of the flux pins 110 come into close contact with top of the bent wafer 10, thereby achieving accurate dotting of the flux 20.

Figure 5A:
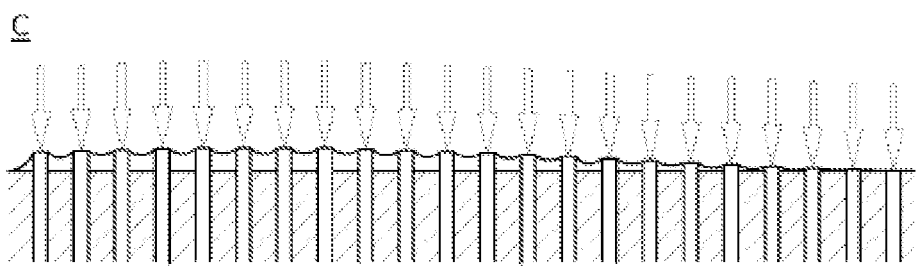
FIGS. 5a and 5b are partially enlarged sectional views showing the flux tool of FIG. 4.
Figure 5B:
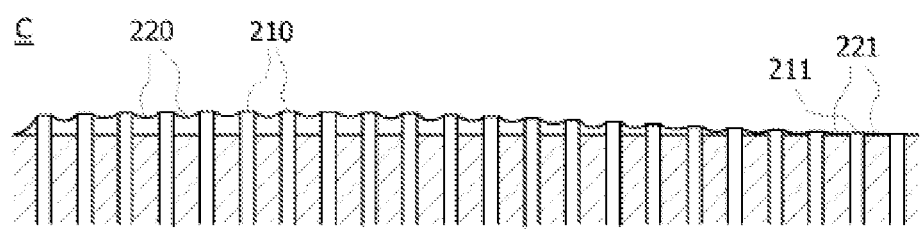

FIGS. 5a and 5b are partially enlarged sectional views showing the portion C of FIG. 3.

FIG. 5a shows arrows representing pressurizing directions, as shown in FIG. 3, and FIG. 5b shows the underside of the elastic pad when the flux pins move upward.

As shown in FIG. 5b, the underside of the elastic pad 200 is divided into contact surfaces 210 coming into contact with the flux pins 110 and spaces 220 between the contact surfaces 210. As the flux pins 110 move upward from top of the pin block 100, the contact surfaces 210 become concaved more upwardly from the underside of the elastic pad 200 than the spaces 220 to thus pressurize each flux pin 110 individually, and the spaces 220 are spaced apart from the pin block 100 according to the warpage occurring from the wafer to thus pressurize the flux pins 110 entirely.

As shown at the right side of FIG. 5b, if the flux pins 110 are exposed or protrude slightly, the contact surfaces 210 are first concaved upward, and the spaces 220 are spaced apart from the pin block 100 slightly or come into contact with the pin block 100 to thus pressurize the flux pins 110.

Figure 4:
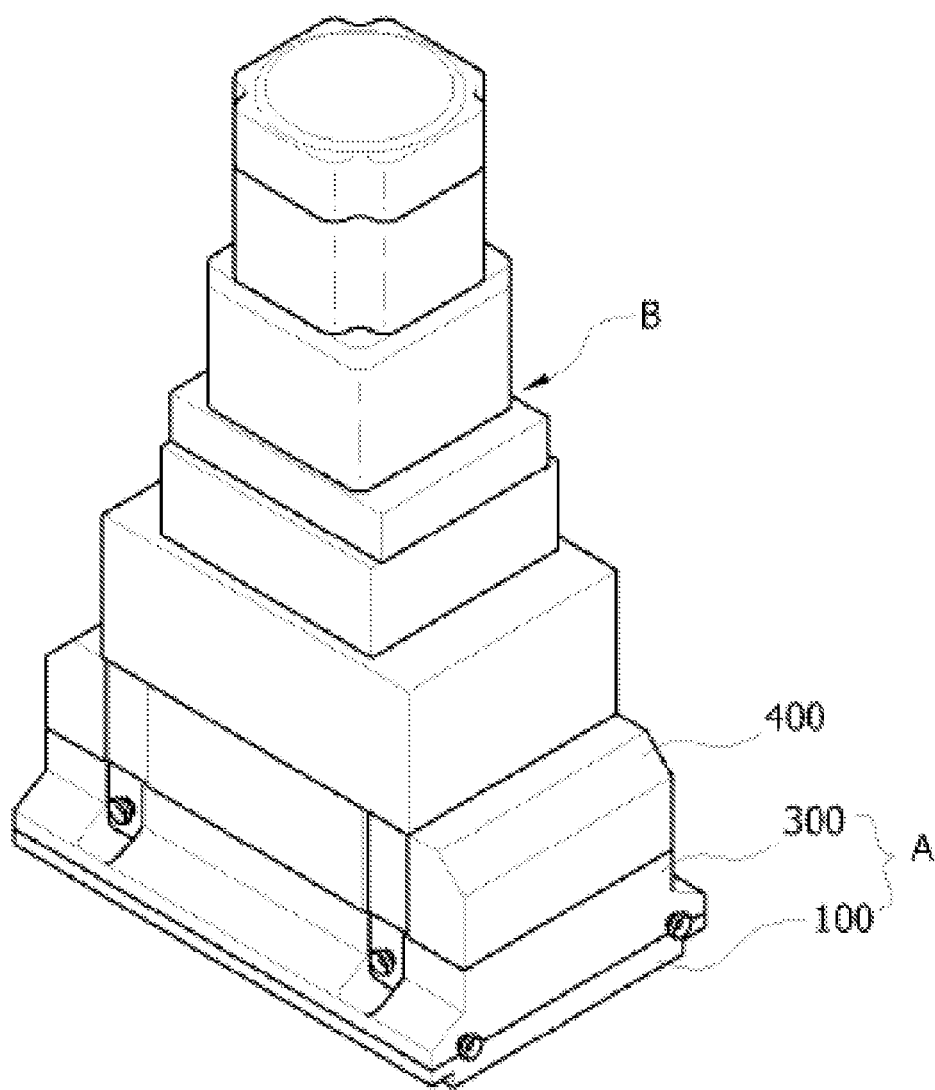
FIG. 4 is a perspective view showing the use state of the flux tool of FIG. 1.

FIG. 4 is a perspective view showing the use state of the flux tool of FIG. 1.

Referring to FIG. 4, the flux tool A according to the present invention is coupled to a driving module B by means of a tool mounting member 400.

The driving module B constitutes the flux printing equipment and is configured to allow a flux storage container and a material such as a wafer or die, on which the flux is printed, to reciprocate.

In specific, the driving module B is movable three-dimensionally in a given space, and to do this, a guide or rail along which the driving module B moves may be freely varied in configuration according to the request of a person having the skill in the art, without being limited to a specific configuration.

Figure 6:
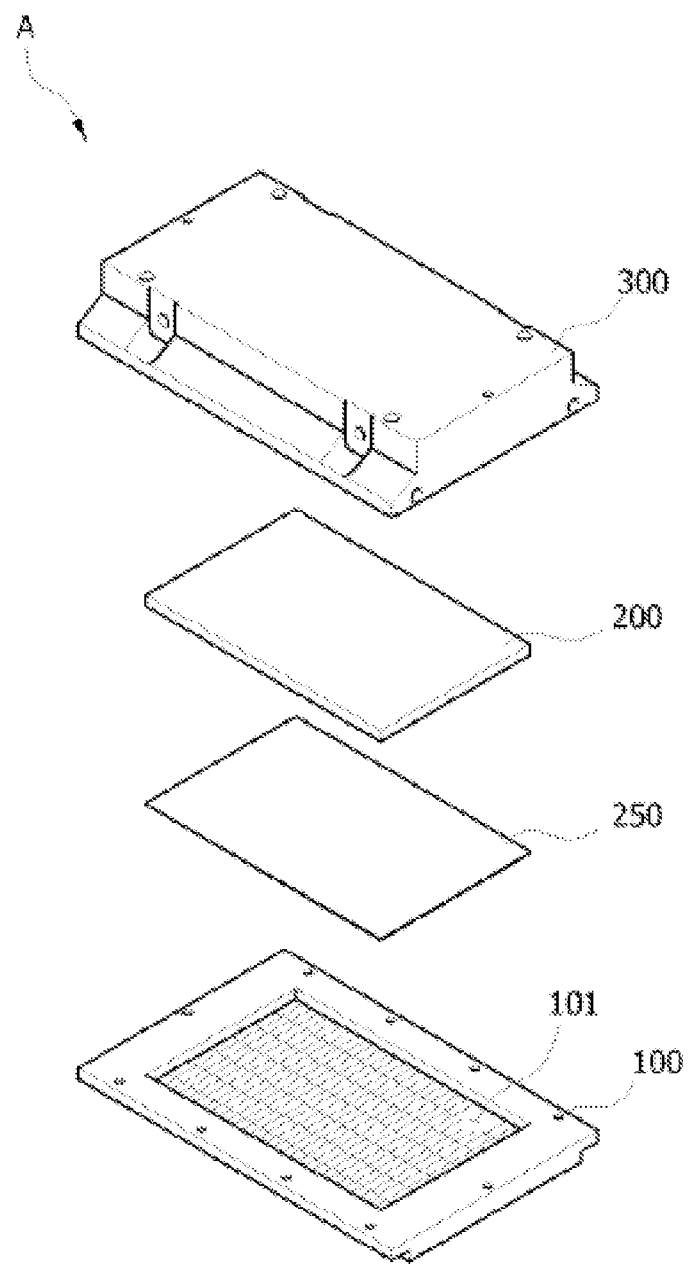
FIG. 6 is an exploded perspective view showing a flux tool using an elastic pad according to another embodiment of the present invention.
Figure 7:
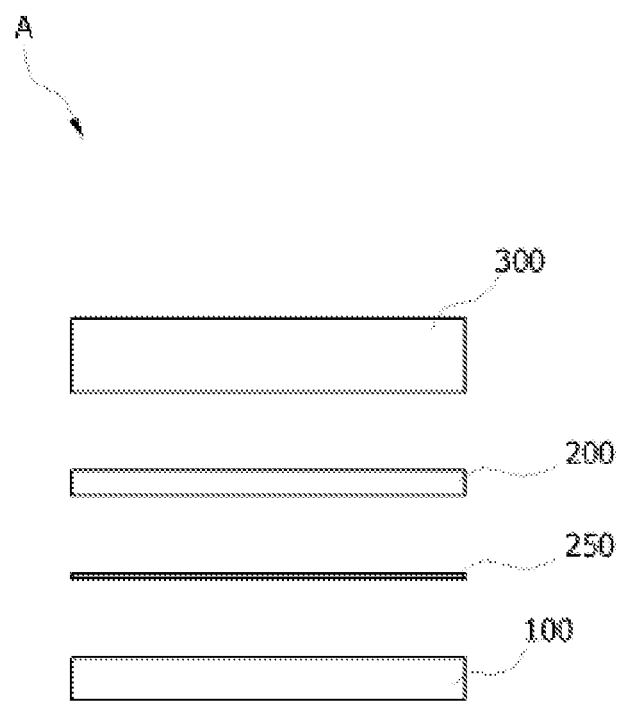
FIG. 7 is an exploded sectional view showing the flux tool using an elastic pad of FIG. 6.

FIG. 6 is an exploded perspective view showing a flux tool using an elastic pad according to another embodiment of the present invention, and FIG. 7 is an exploded sectional view showing the flux tool using an elastic pad of FIG. 6.

As shown in FIG. 6, the flux tool A according to another embodiment of the present invention includes a conductive thin film 250 disposed on the underside of the elastic pad 200. The conductive thin film 250 has electrical conductivity and is made of a conductive material such as a metal, a conductive plastic, and the like.

The conductive thin film 250 prevents static electricity from being generated owing to its conduction, and accordingly, the movements of the flux pins 110 are prevented from being influenced by the static electricity.

Further, if the conductive thin film 250 is made of a material with relatively higher hardness such as a metal than the elastic pad 200, the elastic pad 200 is prevented from being damaged or concavely depressed by the flux pins 110 and thus protected from deformation. As the flux tool A is repeatedly used to repeatedly pressurize tops of the flux pins 110 against the elastic pad 200, the underside of the elastic pad 200 made of silicone may be concaved or torn off, thereby causing the elastic pad 200 to be damaged and deformed.

The flux tool A as shown in FIGS. 6 and 7 shows each part in an exploded configuration, and the conductive thin film 250 comes into close contact with the underside of the elastic pad 200. In some cases, the conductive thin film 250 may be attached to the underside of the elastic pad 200 using an adhesive.

The conductive thin film 250 is made of a material with hardness similar to the elastic pad 200 or low hardness causing damages by the flux pins 110, desirably a conductive plastic. In this case, the conductive thin film 250 may be damaged by the flux pins 110 as the flux tool A is repeatedly used, in the same manner as the elastic pad 200.

Figure 8:
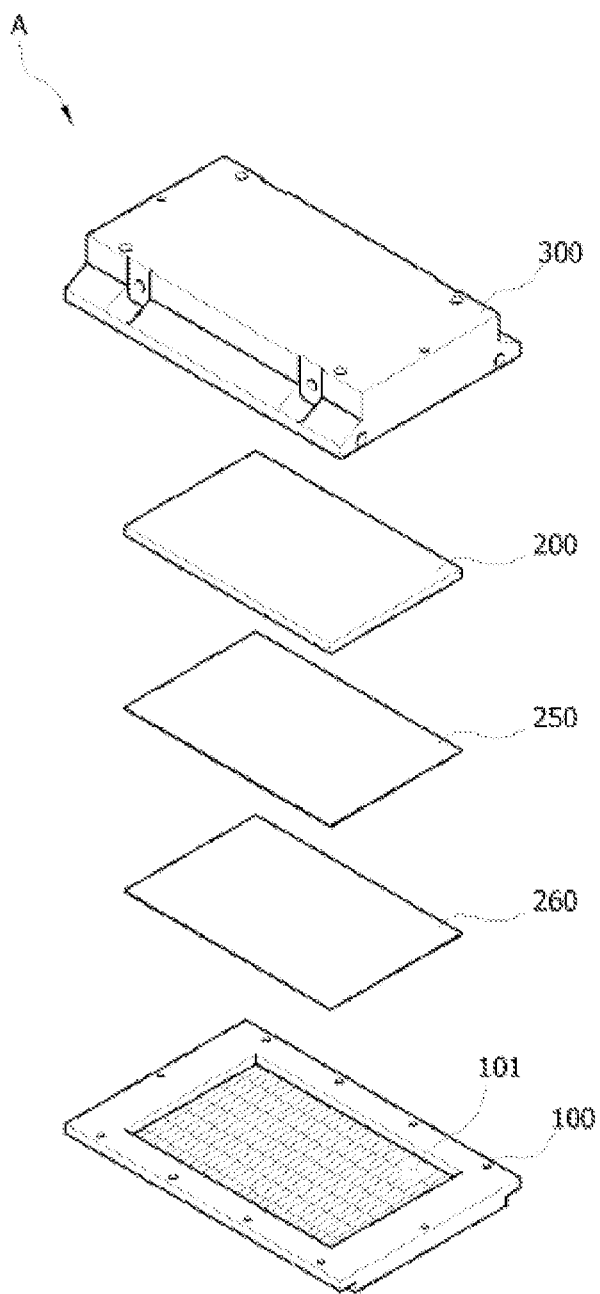
FIG. 8 is an exploded perspective view showing a flux tool using an elastic pad according to yet another embodiment of the present invention.
Figure 9:
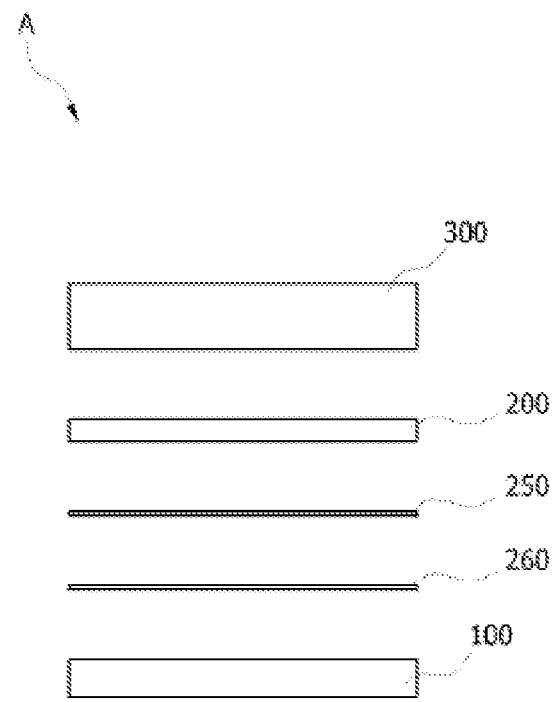
FIG. 9 is an exploded sectional view showing the flux tool using an elastic pad of FIG. 8.

FIG. 8 is an exploded perspective view showing a flux tool using an elastic pad according to yet another embodiment of the present invention, and FIG. 9 is an exploded sectional view showing the flux tool using an elastic pad of FIG. 8.

As shown in FIGS. 8 and 9, the flux tool A according to yet another embodiment of the present invention includes a hard film 260 disposed on the underside of the conductive thin film 250.

As mentioned above, if the conductive thin film 250 is made of a material with hardness similar to the elastic pad 200 or low hardness causing damages by the flux pins 110, it is preferable that the hard film 260 with relatively higher hardness than the conductive thin film 250 to thus cause no damages by the flux pins 110 is disposed on the underside of the conductive thin film 250.

The flux tool A as shown in FIGS. 8 and 9 shows each part in an exploded configuration, and the hard film 260 and the conductive thin film 250 come into close contact with the underside of the elastic pad 200. In some cases, the conductive thin film 250 may be attached to the underside of the elastic pad 200 using an adhesive, and the hard film 260 may come into contact with the underside of the conductive thin film 250 or be attached thereto using an adhesive.

Desirably, the hard film 260 is made of a metal material to ensure given hardness, and as the conductive thin film 250 is provided, it is possible that the hard film 260 is made of a non-conductive material if the given hardness is ensured.

FIGS. 10 to 12b are exploded sectional views showing the flux tool having buffering portions formed on top of the elastic pad according to the present invention.

Figure 10:
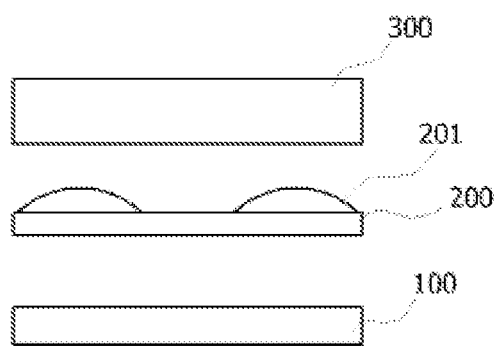
FIGS. 10 to 12b are exploded sectional views showing the flux tool having buffering portions formed on top of the elastic pad according to the present invention.

As shown in FIG. 10, the elastic pad 200 has buffering portions 201 protruding from top thereof.

As the elastic pad 200 is made of the elastic material, of course, it buffers and supports upward and downward movements of the flux pins 110 generated owing to bending such as warpage on the wafer, but if the buffering portions 201 are formed on top of the elastic pad 200, as shown in FIGS. 10 to 12b, the buffering effectiveness of the elastic pad 200 is more improved than before.

While the elastic pad 200 still supports the flux pins 110 by means of its elasticity on the surface thereof, it is bent entirely in shape even in the case where relatively large bending is generated on the wafer, thereby being bent correspondingly to the wafer bent, more advantageously.

As shown in FIG. 10, the buffering portions 201 protrude upwardly from top of the elastic pad 200 to the shape of a sphere whose bottom is cut, and they are formed on both ends of the elastic pad 200. However, if it is assumed that the elastic pad 200 is relatively large, a plurality of buffering portions are spaced apart from one another by a given distance in horizontal and vertical directions of the elastic pad 200. Accordingly, the plurality of buffering portions may be selectively used according to the bending characteristics of the wafer.

Figure 11A:

FIG. 11a shows three buffering portions 202 formed on top of the elastic pad 200, and as mentioned above, if it is assumed that the elastic pad 200 is relatively large, a plurality of buffering portions are spaced apart from one another by a given distance in horizontal and vertical directions of the elastic pad 200.

Figure 11B:
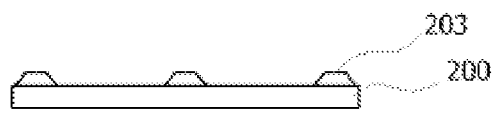

FIG. 11b shows three trapezoidal buffering portions 203 with inclined sides formed on top of the elastic pad 200, and as mentioned above, if it is assumed that the elastic pad 200 is relatively large, a plurality of buffering portions are spaced apart from one another by a given distance in horizontal and vertical directions of the elastic pad 200. Even though not shown in FIGS. 11a and 11b, buffering portions with inclined front and back surfaces and sides may be provided to the shape of a square pyramid whose top is cut.

Figure 12A:
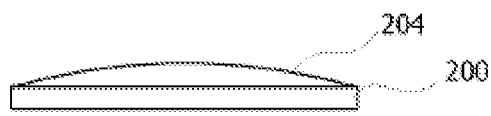
Figure 12B:
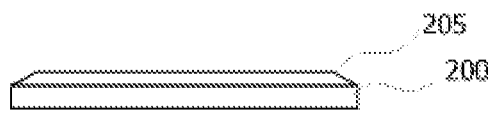

FIG. 12a shows a buffering portion 204 formed entirely on top of the elastic pad 200 to the shape of a sphere whose bottom is cut to a smooth degree, and FIG. 12b shows a trapezoidal buffering portion 205. If deformation becomes serious on the sides of the wafer according to the characteristics of the wafer, the buffering portions 204 and 205 are selected and used.

Such various shapes and arrangements of the buffering portions, as shown in FIGS. 10 to 12b, may be selectively used according to the bending characteristics of the wafer.

While the flux tool using the elastic pad according to the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The foregoing description of the embodiments of the invention has been presented for the purpose of illustration; it is not intended to be exhaustive or to limit the invention to the precise forms disclosed.

INDUSTRIAL APPLICABILITY

The present invention is applicable to semiconductor fields, semiconductor package manufacturing fields, PCB manufacturing fields, particularly wafer level chip scale package (WLCSP)-based manufacturing fields, solder ball placement system fields, flux tool and flux printing equipment having the flux tool fields, and other fields similar or related thereto, thereby improving reliability and competitiveness of products.

The invention claimed is:

1. A flux tool of flux printing equipment for dotting flux for attaching solder balls to a wafer of a semiconductor chip package, the flux tool comprising:
   a pin block having a plurality of pin holes formed thereon in a pattern and a plurality of flux pins configured to be inserted into the pin holes; and
   at least one elastic pad disposed on top of the pin block to pressurize the flux pins,
   wherein the number of the flux pins corresponds to the number of the pin holes, such that, in dipping and dotting processes, the flux pins inserted into the pin holes move upward and downward from the pin holes, independently of one another, and the elastic pad has a conductive film located on an underside thereof,
   wherein the conductive film is made of a non-metal conductive material, and the elastic pad includes an additional film located on an underside of the conductive film, the additional film having a hardness greater than those of the conductive film and the elastic pad.

2. The flux tool according to claim 1, wherein the elastic pad is configured to allow the flux pins moving to interiors of the pin holes in the dipping and dotting processes to return to the original positions thereof, have a heat resistance capable of resisting heat generated in a cleaning process, and pressurize each flux pin individually by elastic force generated therefrom to allow the flux pins to be uniformly pressurized against the wafer or a die, the elastic pad being divided into contact surfaces coming into contact with the flux pins and spaces between the contact surfaces, whereby as the flux pins move upward from a top of the pin block, the contact surfaces become concaved more upwardly from the underside of the elastic pad than the spaces to pressurize each flux pin individually, and the spaces are spaced apart upwardly from the pin block or come into contact with the pin block by a bent shape of the wafer or die to pressurize the flux pins entirely.

* * * * *